United States Patent
Seo et al.

(10) Patent No.: US 6,534,921 B1
(45) Date of Patent: Mar. 18, 2003

(54) METHOD FOR REMOVING RESIDUAL METAL-CONTAINING POLYMER MATERIAL AND ION IMPLANTED PHOTORESIST IN ATMOSPHERIC DOWNSTREAM PLASMA JET SYSTEM

(75) Inventors: Sang-Hun Seo, Taejon (KR); Kyeong-Koo Chi, Seoul (KR); Ji-Soo Kim, Yongin (KR); Chang-Woong Chu, Suwon (KR); Seung-Pil Chung, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/708,737

(22) Filed: Nov. 9, 2000

(51) Int. Cl.[7] .................................................. H01J 7/24
(52) U.S. Cl. ............................ 315/111.51; 315/111.11; 315/111.81; 134/22.18; 134/22.11; 134/1.1; 134/1.2
(58) Field of Search ....................... 315/111.51, 111.11, 315/111.21, 111.41, 111.81, 111.91; 134/1.1, 1.2, 1.3, 21, 21.1, 21.18, 21.19

(56) References Cited

U.S. PATENT DOCUMENTS

| 4,474,621 A | | 10/1984 | Saccocio et al. ............... 134/1 |
|---|---|---|---|
| 5,356,478 A | * | 10/1994 | Chen et al. ..................... 134/1 |
| 5,767,627 A | | 6/1998 | Siniaguine ............. 315/111.41 |
| 5,988,187 A | * | 11/1999 | Trussell et al. ............ 134/22.1 |
| 6,040,548 A | * | 3/2000 | Siniaguine ............. 219/121.48 |
| 6,062,237 A | * | 5/2000 | Brown et al. ................. 134/1.1 |
| 6,105,589 A | * | 8/2000 | Vane .......................... 134/1.1 |

FOREIGN PATENT DOCUMENTS

| CA | 2210130 | 7/1997 |
|---|---|---|
| EP | 807 964 | 11/1997 |
| RU | 2075135 | 1/1995 |
| RU | 2032281 | 3/1995 |
| WO | 96/21943 | 7/1996 |

* cited by examiner

*Primary Examiner*—Don Wong
*Assistant Examiner*—Tuyet T. Vo
(74) *Attorney, Agent, or Firm*—Lee & Sterba, P.C.

(57) ABSTRACT

A method of removing metal-containing polymeric material and ion implanted or plasma damaged photoresist from a surface using a plasma jet system, by generating radicals having high energy and high density from atmospheric plasma by introducing a reactant gas to the plasma, and placing the surface at a distance from the plasma, whereby ionic reaction on the surface is minimized while the removing action of the radicals on the surface is maintained.

26 Claims, 9 Drawing Sheets

| BOND | ENERGY(Kcal/mole) |
|------|-------------------|
| C–O  | 124 |
| C–C  | 80  |
| C=C  | 142 |
| C≡C  | 186 |
| C–H  | 99  |
| C–F  | 102 |
| H–H  | 104 |
| F–F  | 37  |
| H–F  | 135 |

METHOD FOR REMOVING RESIDUAL METAL-CONTAINING POLYMER MATERIAL AND ION IMPLANTED PHOTORESIST IN ATMOSPHERIC DOWNSTREAM PLASMA JET SYSTEM

BACKGROUND OF THE INVENTION

1. Field of the Invention

The present invention is generally directed to the field of removing residual materials from a surface and, more particularly, is directed to the field of removing ion implanted or plasma damaged photoresist materials and metal-containing polymeric photoresist materials from the surface of semiconductor devices.

2. Background of the Invention

Name of Ion-Implantation or Plasma Damaged Photoresist

Contemporary photolithography technologies are widely adopted to define various mask patterns for etching or ion-implantation. In this technology, photoresist materials are coated, exposed to light, and developed to form photoresist patterns, and by using photoresist patterns as masks, patterning, etching or ion-implantation processes follow. Thereafter, the remaining residual photoresist material should be removed for subsequent processing.

Unfortunately, the remaining photoresist residue is likely to be of a different chemical structure and property than those of the photoresist material as initially coated. This difference makes it difficult to remove the remaining residual photoresist material.

Figure 5:
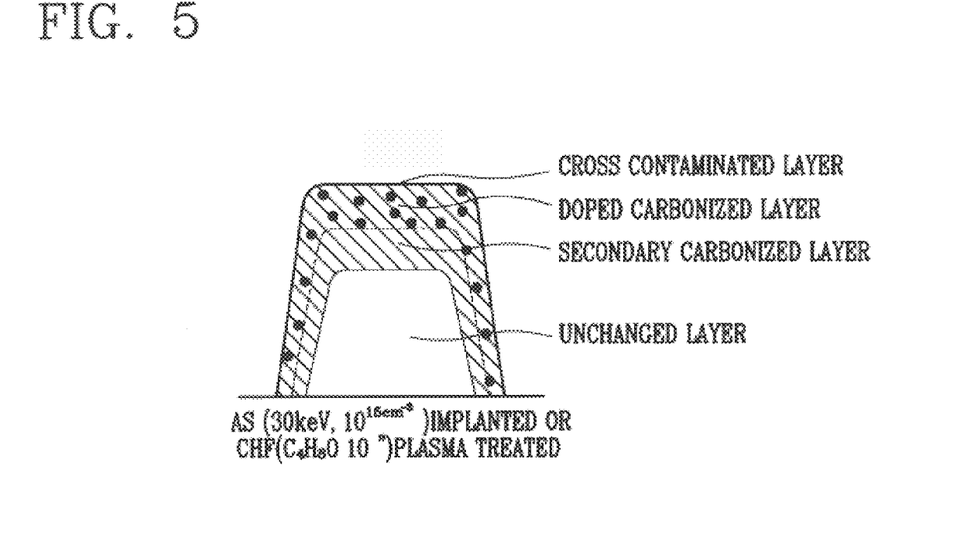
FIG. 5 is a schematic, cross-sectional view showing a hardened surface layer of photoresist residue.
Figure 6:
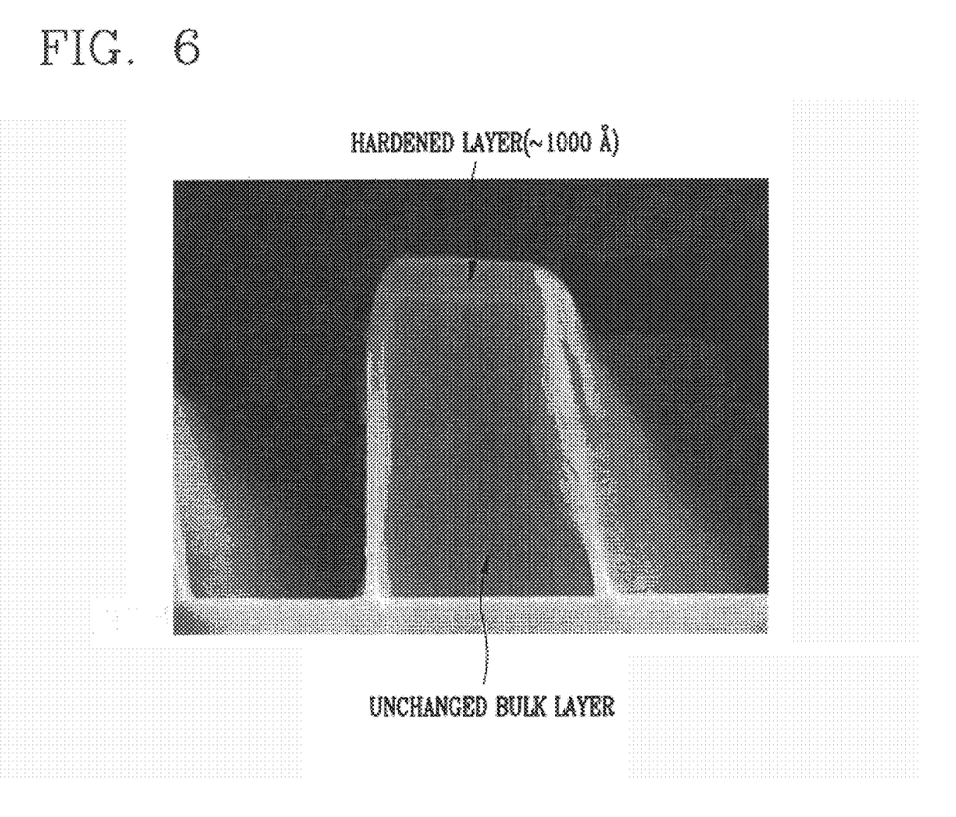
FIG. 6 is a photomicrograph showing the hardened surface layer of photoresist residue.
Figure 7:
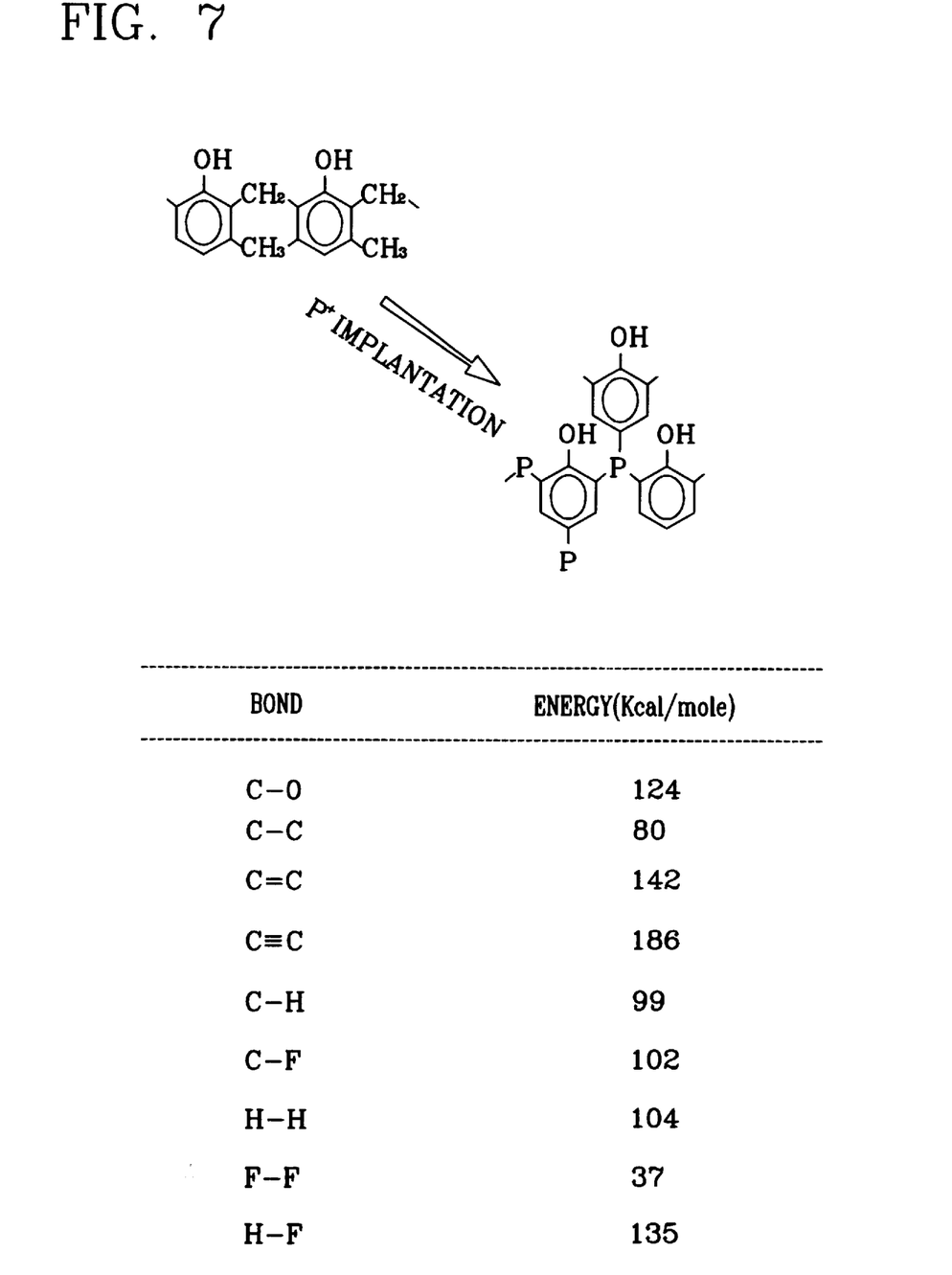
FIG. 7 shows the chemical structure of hardened layers of photoresist residue and chemical binding energies of various chemical bonds.
Figure 8:
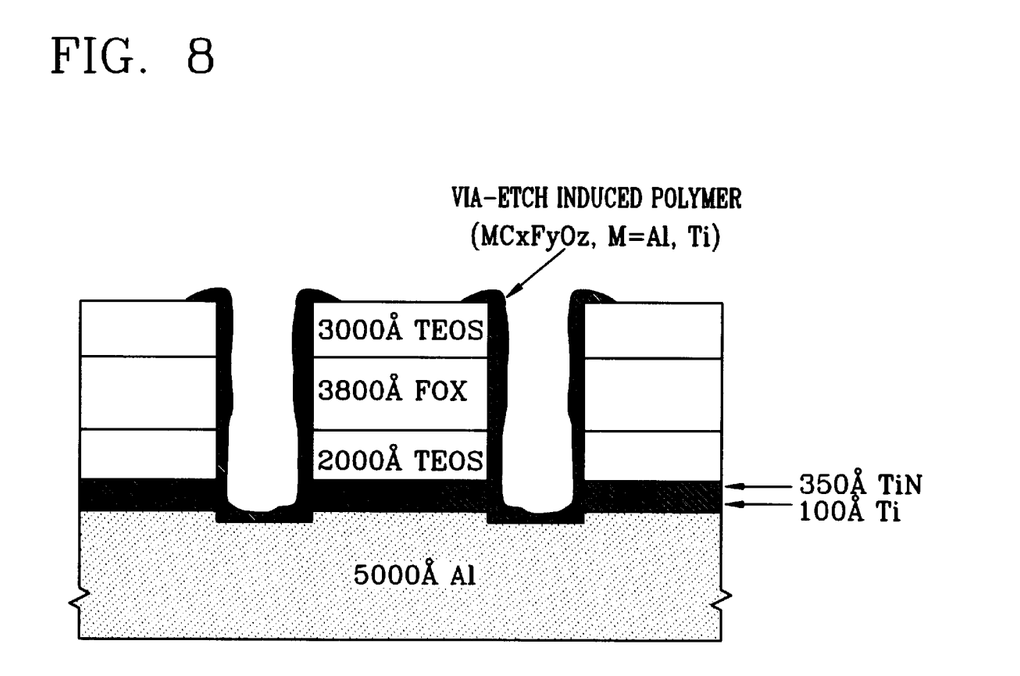
FIG. 8 is a schematic diagram showing a via etch induced, metal-containing polymer.

During N-well, P-well ion implantation, the masking photoresist is damaged forming a hardened surface layer containing carbon-rich, low hydrogen cross-linked polymer. FIGS. 5 and 6 show a hardened surface layer of photoresist residue. It is extremely difficult to remove such a layer using conventional oxygen based ashing processes. Instead, wet treatment using sulfuric acid, or multi-step dry cleaning using ion-collision phenomenon has been widely adopted in the field to remove such layers. The drawback of wet treatment is that it has a tendency to cause substrate silicon recesses. The drawback of multi-step dry cleaning is that it is complicated, expensive and time consuming.

Accordingly, there is a need for a method of removing the remaining residual photoresist material in a simple, low-cost, and efficient manner.

Nature of Via-Etch Induced Polymer

When forming via contact holes connecting lower and upper metal layers in intermetal dielectric(IMD) materials (such as aluminum in via hole), via-etch induced, metal-containing hard polymer materials become coated along the sidewalls of via contact holes by virtue of sputtering during over-etch. Such polymer materials usually contain F (fluorine), which is derived from via etching gas components, as well as metal from metal lines. The chemical composition of such polymer can be generally represented as $MC_xF_yO_z$, where M is a metal atom, e.g., Al or Ti, and x, y, and z are 0, 1, 2, or 3 and so on.

In an effort to enhance polymer removal ability, it has been suggested to apply fluorine containing gas. However, the use of fluorine containing gas is not a desirable solution from an environmental perspective. Additionally, it is difficult to control and limit or contain the action of fluorine Moreover, fluorine containing gas does not present a completely acceptable or desirable solution from the perspective of incompatible or conflicting process considerations as well as from the consideration of undesirable attacks on underlying oxide materials in a semiconductor device.

Plasma Processing Systems

Figure 1:
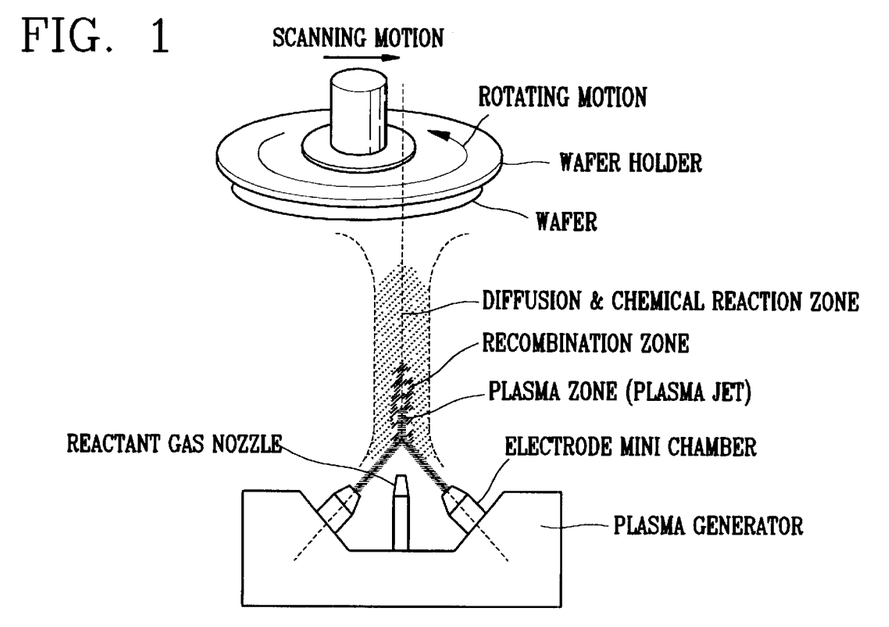
FIG. 1 is a schematic diagram showing a simple atmospheric plasma jet system.
Figure 2:
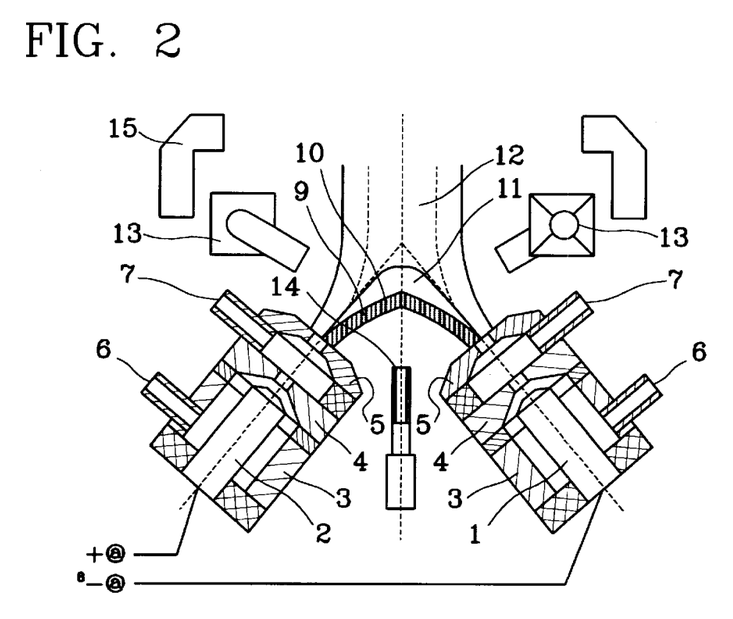
FIG. 2 is a schematic diagram showing a plasma jet system having two torches.

Plasma has been widely used to deposit or etch various materials on a surface. The use of plasma processing systems is disclosed, for example, in Russian Patent Nos. 2,032,281 (Mar. 27, 1995) and 2,075,135 (Jan. 13, 1995), (PCT International Publication No. WO96/21943) (inventors O. V. Siniaguine and I. M. Tokmulin), and these references are incorporated herein in their entirety by reference. In the system disclosed in Russian Patent No. 2,032,281, two or four electrode units emit jets of plasma carrying gas. The jets carry electric current, and the direction of the jets is controlled by forces generated by interaction of this current with magnetic fields created by the system. FIGS. 1 and 2 show a typical atmospheric plasma jet system employing two torches.

Figure 3:
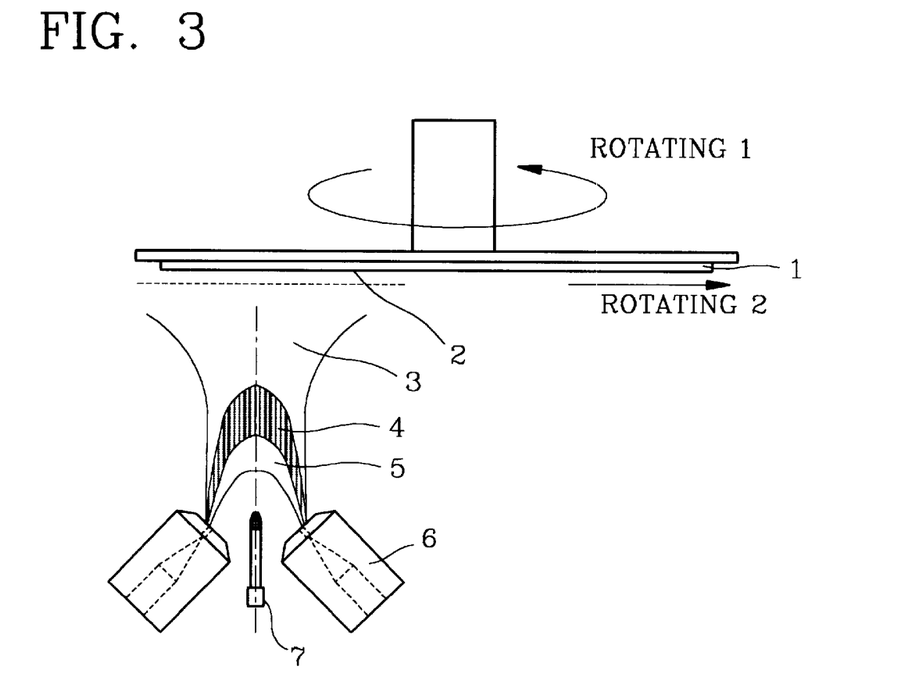
FIG. 3 is a schematic diagram showing a dual rotating arrangement of a tray of holders in a plasma jet system.
Figure 4:
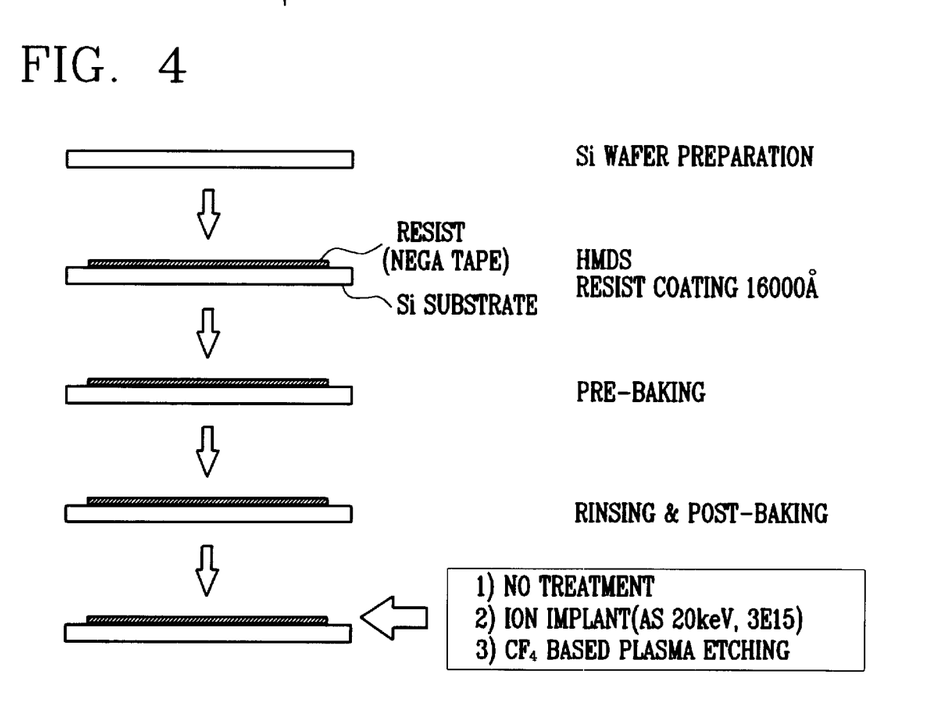
FIG. 4 is a step-by-step diagram showing how a set of sample wafers may be prepared.

The plasma jet system disclosed in Russian Patent No. 2,075,135 has a plasma jet generator, a gas supply means, and a set of holders for wafers to be treated in a closed chamber. The holders are made in the form of a horizontal platform to rotate about an axis passing through the geometric center thereof perpendicular to the horizontal platform. Each holder is also made to spin about an axis passing through the geometric center of the holder perpendicular to the plane of the holder. FIG. 3, is a schematic diagram that shows this dual rotational arrangement. The plasma jet is directed from the bottom upwards towards the horizontal platform of the wafer holder. Associated with the wafer holder is a manipulator or handler that delivers and retrieves wafers from the holder to a storage device that stores wafers. In operation, a wafer is selected by the manipulator or handler from the storage device and placed in the wafer holder inside a chamber. The manipulator is removed from the chamber, and the chamber is closed. The holder is made to rotate about its axis and thereby expose each wafer in the wafer holder to the action of the plasma jet. In the case of loading a series of holders in the form of a horizontal platform, the entire platform is also made to rotate about its geometric center in order to afford equal and uniform exposure of each wafer to the plasma jet. After treatment, the treated wafers are removed from the wafer holders by the manipulator or handler, and a new batch of wafers are placed in the wafer holders by the manipulator or handler for treatment by the plasma jet.

Plasma generation and plasma processing of materials is also disclosed in U.S. Pat. No. 5,767,627 to Siniaguine which is also incorporated herein in its entirety by reference. This reference discloses a plasma generator having a pair of electrode units for generating a plasma flow in a first direction towards or away from the second plasma flow, and a second magnetic field generator for moving the first and second plasma flows in a direction.

Since polymers having oxidized or fluorinated metal, e.g., Al—O or Al—F, are chemically very stable, these types of polymer materials are very difficult to completely remove using conventional ashing techniques, such as those techniques that are oxygen ($O_2$) based. In the case of conventional oxygen ($O_2$) based, low pressure, radio frequency (RF) plasma ashing, due to the longer mean-free-path of ions, as compared with a plasma jet system, more ions can survive and reach the surface of a wafer, which results in charge-up damage to the devices. Moreover, as previously mentioned, F containing gases like $CF_4$ have to be introduced to completely remove the polymer, and such an introduction is not a desirable solution in view of process compatibility issues and environmental issues as previously mentioned.

As previously mentioned, ion implanted or plasma damaged photoresist residue has a hardened surface coating layer of a different chemical structure and property than those of the photoresist material as initially coated. Referring to FIGS. 5 and 6, the hardened surface coating layer is multi-layered having different chemical compositions. Carbonized or graphitized layers having carbon-rich and low-hydrogen properties and metal-doped, carbonized layers of cross-linked polymer having a 3D-network structure containing impurities and dose-oxide compound residue are formed. The carbonized layer is rigid and brittle. As is well known in the art, this hardened layer is not easily removed using conventional plasma ashing.

Any remaining photoresist residue or incomplete ashing may act as a particle source or affect various electrical characteristics. Accordingly, complete removal of the photoresist residue having a hardened surface layer, which is formed during ion-implantation or plasma etching, is critical to the manufacture of reliable semiconductor device and related or like products.

Figure 9:
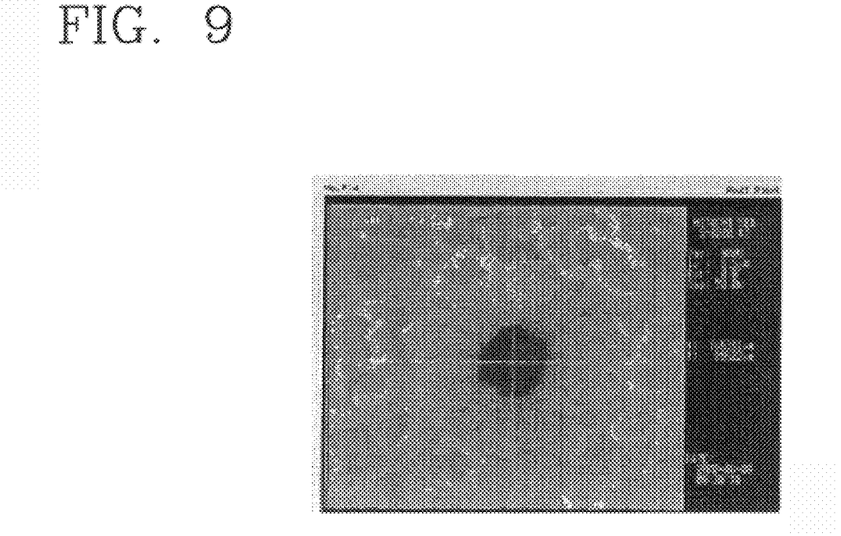
FIGS. 9 and 10 are photomicrographs showing the via etch induced, metal-containing polymer residue.
Figure 10:
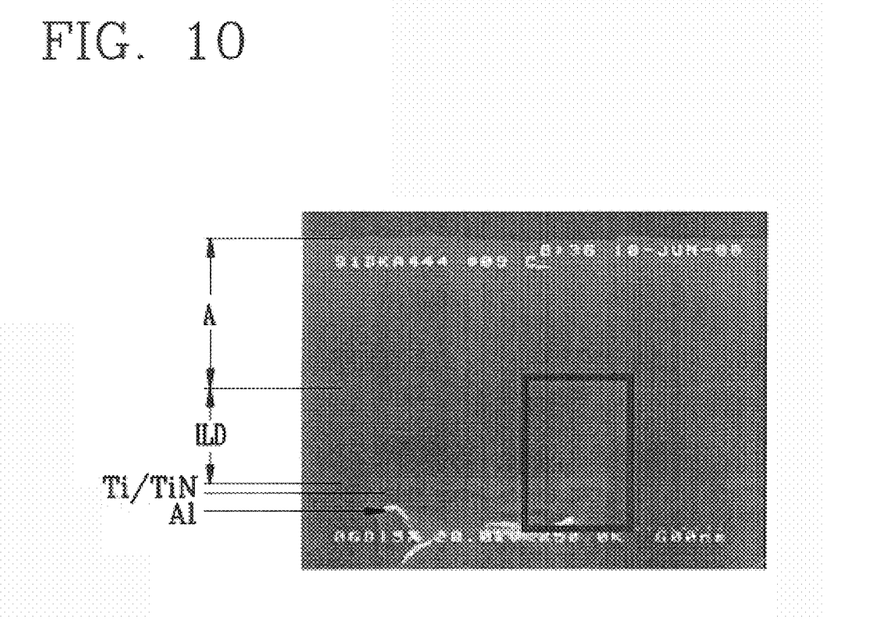

FIGS. 9 and 10 show the hard polymer just after the via hole etching is completed. Hard polymers containing metal components are formed over the entire wafer surface. From FIGS. 9 and 10, it is apparent that a polymer material having a thickness of a few hundred Å exists along the via sidewalls.

Figure 11:
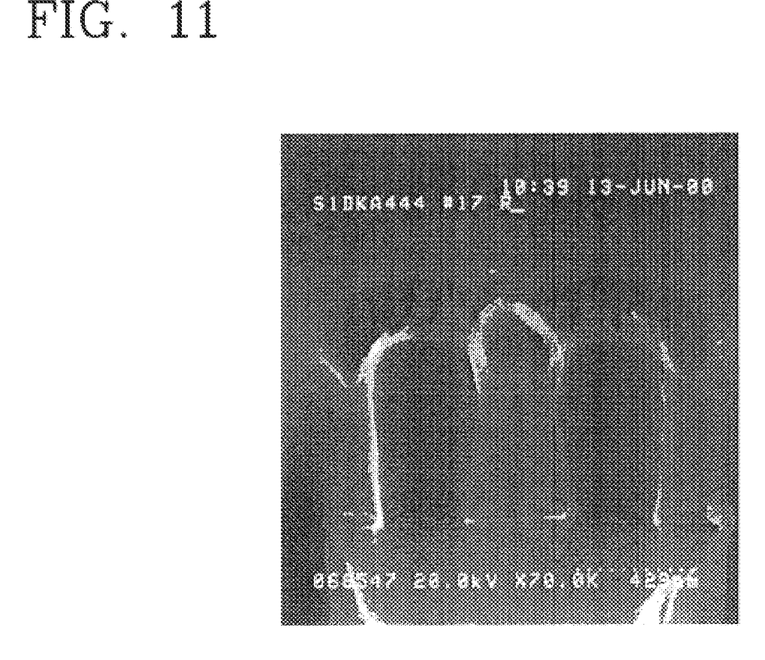
FIGS. 11 and 12 are photomicrographs showing the via etch induced, metal-containing polymer around the via hole sidewall after conventional oxygen based, plasma ashing process.
Figure 12:
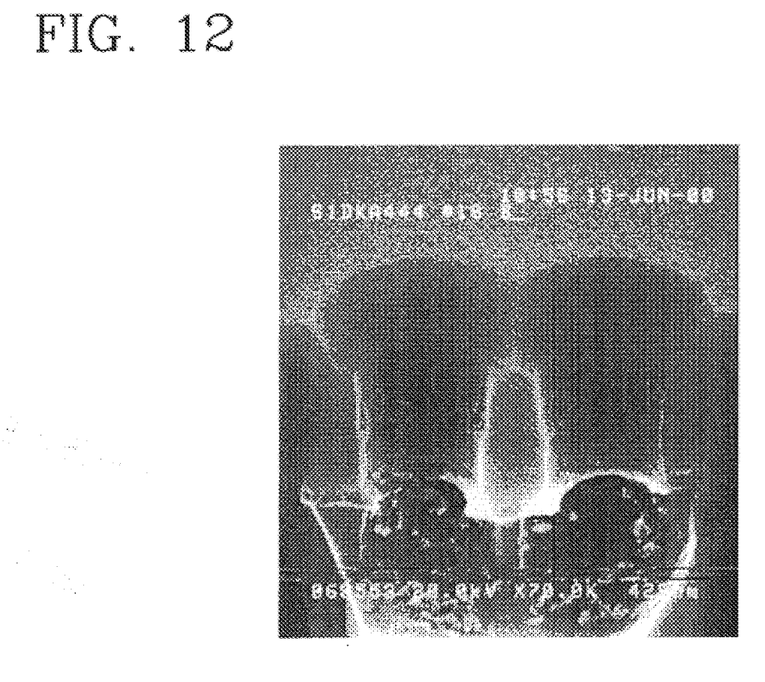

Referring to FIGS. 11 and 12, a substantial portion of this polymer material along the via hole sidewall is left after conventional photoresist ashing is carried out This kind of polymer material is extremely difficult to remove, because it normally has a very low vapor pressure. The remaining residual polymer material affects contact resistance and thus causes serious reliability problems as related to the functions of the devices. Therefore, complete removal of the hard polymer material, which is formed during the via hole etching step, has crucial importance to the manufacture of reliable semiconductor devices.

While the use of plasma generating systems have been employed to etch materials from surfaces, none of the prior art plasma systems provide completely satisfactory removal of metal-containing polymeric photoresist material from the surface of semiconductor devices. Accordingly, the present invention addresses this need for a more satisfactory method for complete removal of metal-containing polymeric photoresist material from a surface, especially the surfaces of semiconductor devices as well as from the surface of other types of similar materials, including plates, sheets and wafers, substrates, printed circuit boards, compact disks and other products.

SUMMARY OF THE INVENTION

According to a feature of an embodiment of the present invention, there is provided a method of removing metal-containing polymeric material and ion implanted photoresist or plasma damaged photoresist from a surface using a plasma jet system, comprising generating radicals having high energy and high density from atmospheric plasma by introducing a reactant gas to the plasma, and placing the surface at a distance from the plasma, whereby ionic reaction on the surface is minimized while the removing action of the radicals on the surface is maintained between about 100 to about 300 degrees centigrade. The flow rate of oxygen may be between about 1 to 5 liters per minute.

In accordance with another feature of an embodiment of the present invention, an atmospheric downstream plasma jet (a form or derivative of arc plasma) system is employed. By utilizing high density and high energy are plasma generated by the equipment, oxygen radicals of relatively high density are generated and used for ashing to completely remove via polymer residues (in other words, metal containing hard polymer) having relatively stable and strong chemical bonding.

DESCRIPTION OF PREFERRED EMBODIMENTS

Preferred embodiments of the invention will now be described more fully hereinafter with reference to the accompanying drawings. This invention may be embodied in many different forms and applications and should not be construed as being limited to the embodiments set forth herein. Rather, these embodiments are provided so that this disclosure will be thorough and complete and will fully convey the scope of the invention to those of ordinary skill in the art. It will be understood that when a layer is referred to as being "on" another layer or substrate, it can be directly on the other layer or substrate, or intervening layers may also be present.

A preferred embodiment of the present invention is directed to an improved method of removing via-etch induced polymer, particularly metal-containing post-etch polymer residue and ion implanted implantation damaged photoresist. The present invention may be practiced using any plasma generating system employing at least one plasma jet. The present invention represents a novel approach in the use of a plasma generating system to remove metal-containing polymeric photoresist material and ion implanted implantation damaged photoresist material from a surface. At the core of this invention is the discovery by the inventors that a reactive gas, e.g., $O_2$, of relatively high density is generated when the reactive gas, oxygen $O_2$, is passed through an atmospheric downstream plasma jet.

The present invention is also directed to an improved method of photoresist ashing, wherein the energy of oxygen radicals does not have to be much higher than that of a C—H or C—C bond. Even with a small activation energy, spontaneous reaction, such as $C_xH_y+2O \rightarrow CO$, $CO_2$, $H_2O$, $C—H+2O \rightarrow CO$, $CO_2$, $H_2O$, and $C—C+2O \rightarrow CO$, $CO_2$, occurs to remove photoresist materials. However, to remove hardened photoresist residues, additional activation energy beyond the energy required to remove normal photoresist is required to break the high concentration of C=C for carbonized layer and the cross-linked structure for the doped carbonized layer into CO or $CO_2$ as in $C=C+2O \rightarrow CO$, $CO_2$. Such additional energy is supplied by oxygen radicals of high density and high temperature produced when oxygen is passed through an atmospheric downstream plasma jet system.

"Downstream plasma jet" or "downstream zone or region" refers to a region in a plasma generating system where the density of plasma species, such as electrons, ions, and neutrals including molecules and atoms, etc., decreases and the harmful or destructive effects of the charged particles of the plasma on a surface are minimized. By "minimized," what is meant is that the level of ionic reaction and consequent damage to the surface does not interfere with the function of the surface. In other words, "minimized" destruction refers to damage that is inconsequential and that which does not render the device inoperable. The plasma species generated from a plasma source region, where plasma heating and generation of charged particles occur, move by diffusion away from the plasma source region to a downstream region having a decreased plasma density. In this downstream region, the harmful or destructive effects of the charged particles of the plasma on a surface are minimized or at most inconsequential. The inventors of this invention have developed a novel method of removing metal-containing polymeric material as well as ion implantation damaged photoresist material, in particular from a surface, especially semiconductor surfaces, by generating high energy and high density radicals and exposing a surface having photoresist material to be removed at a downstream plasma jet or downstream zone or region.

Referring now to FIG. 1, there is shown a representative diagram of a known atmospheric plasma jet system adapted for treating wafers. Referring to FIG. 2, there is shown a schematic diagram of a plasma generating system having two torches, wherein a cathode 1 is incorporated in one torch and an anode 2 is connected to the second torch. In FIG. 2, there is shown a cathode 1, an anode 2, frames 3, diaphragm 4, emitter 5, protecting gas 6, plasma forming gas (Ar) 7, DC power supply 8, electric arc 9, current jet 10, plasma zone 11, diffusion zone 12, solenoids 13 with magnet conductors, reactant gas nozzle 14, and a monitoring system 15. It is understood, of course, that the plasma jet system is enclosed within a chamber.

To generate plasma in accordance with an embodiment of the present invention, an inert gas is injected to the two torch electrodes (7). The inert gas may be argon, nitrogen, or helium with or without nitrogen.

A reactant gas, which functions to remove hard polymer, is injected through the reactant gas nozzle (14) positioned between the two torch electrodes. The reactant gas may be oxygen ($O_2$). The reactant gas is passed through the plasma zone or region 11 to generate radicals having high energy and high density. To control the location of the plasma, a light magnetic field less than or equal to about 10 gauss is applied to the two electrodes through a solenoidal coil.

In the meantime, wafers are provided in an upside down configuration, as shown in FIG. 1, facing the upward directing plasma jet of the plasma generator. The wafer holders revolve around the principal axis in a manner similar to the rotation of the earth around the sun to enhance process uniformity.

Contrary to the above mentioned conventional ashing, the atmospheric downstream plasma jet system allows a relatively shorter ion lifetime, which results in reduced charge-up damages because fewer ions can reach the wafer due to shorter mean-free path of ions that invite more frequent neutralization. As used in the present invention, such plasma jet systems generate high density radicals, that realize a high dissociation rate, by introducing a reactant gas such as $O_2$ through the plasma zone 11. In other words, reactant gas such as $O_2$ is introduced from the reactant gas nozzle 14, passes through the plasma zone 11, and reaches the wafer in the form of high density high energy oxygen radicals. Therefore, a plasma jet system employed in accordance with an embodiment of the present invention is essentially free from charge-up damage as compared to the conventional asher.

In the case of a single torch system, the plasma forming gas and reactant gas are injected from a single torch electrode and in a same direction. In addition, a relatively higher thermal flux of oxygen radicals is obtained from this atmospheric downstream plasma jet system. That is to say that oxygen radicals of the present invention possess high kinetic or thermal energy, because the processes are performed by the radicals in the downstream region of the system. Owing to such high temperature and neutrality of the radicals, the polymer materials transform to a more dissociable or soluble state without causing serious charging problems. While doing so, the system power should be appropriately adjusted in order not to excessively cool down the temperature of the radicals when the radicals pas through the the plasma zone.

Process parameters and corresponding value ranges for via polymer ashing in accordance with an embodiment of the present invention are as follows.

Wafer temperature: 100–300° C.

Ar flow rate: 0.5–1 l/min

Torch to wafer distance: 100–200 mm

Minimum plasma generation DC power: 5–15 kW magnetic field: 13 gauss wafer rotation: 10–15 cycles/sec Plasma to nozzle distance: 10–15 mm $O_2$ flow rate: 1–5 l/min depending on the plasma generation power.

Table 1 summarizes preferred process parameters in accordance with an embodiment of the present invention.

TABLE 1

| No | Parameter | Value | Comments |
|---|---|---|---|
| 1 | Power of Plasma Generator (kW) | 5–15 | except ignition power |
| 2 | Plasma forming gas flow rate (l/mm) | 0.5–1 | argon |

TABLE 1-continued

| No | Parameter | Value | Comments |
|---|---|---|---|
| 3 | Reactant gas flow rate (l/min) | 1–5 | oxygen |
| 4 | Total plasma exposure time (sec) | ≦300 | Not total process time |
| 5 | Wafer angular velocity (cycles/sec) | 10–15 | |
| 6 | Wafer Temperature (degrees Centigrade) | ≦200 | Control with Bell law and cooling time |
| 7 | Distance between torch and wafer (mm) | 80 200 | |
| 8 | Distance between nozzle and plasma (mm) | 5–15 | |
| 9 | Magnetic Field for Plasma Position Control (gauss) | 13 | |

Process Sequence of A Preferred Embodiment

Sample test wafers are prepared as follows:

(1) First, aluminum metal layer having a thickness of 5000 Å is deposited.
(2) 100 Å Ti and 350 Å TiN are sequentially deposited.
(3) 8800 Å of interlayer dielectric materials are deposited.
(4) By using photoresist mask and F-based etching mechanism, the interlayer dielectric materials are removed to form via contact hole. In practical via etching process, to enhance the connection between the upper and lower metal layers, the lower aluminum metal layers are etched to some extent.

Figure 13:
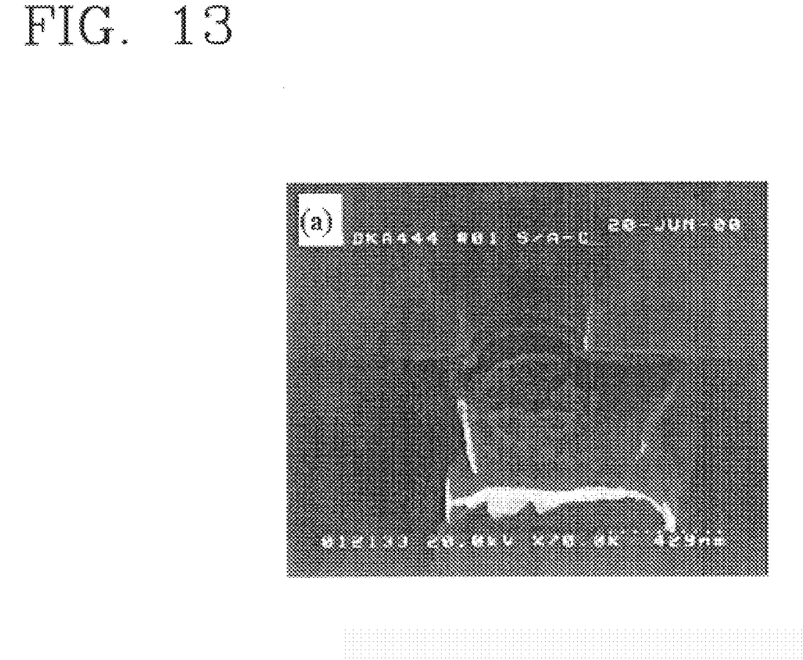
FIGS. 13 and 14 are photomicrographs showing the via hole profile after plasma jet ashing and EKC stripping.
Figure 14:
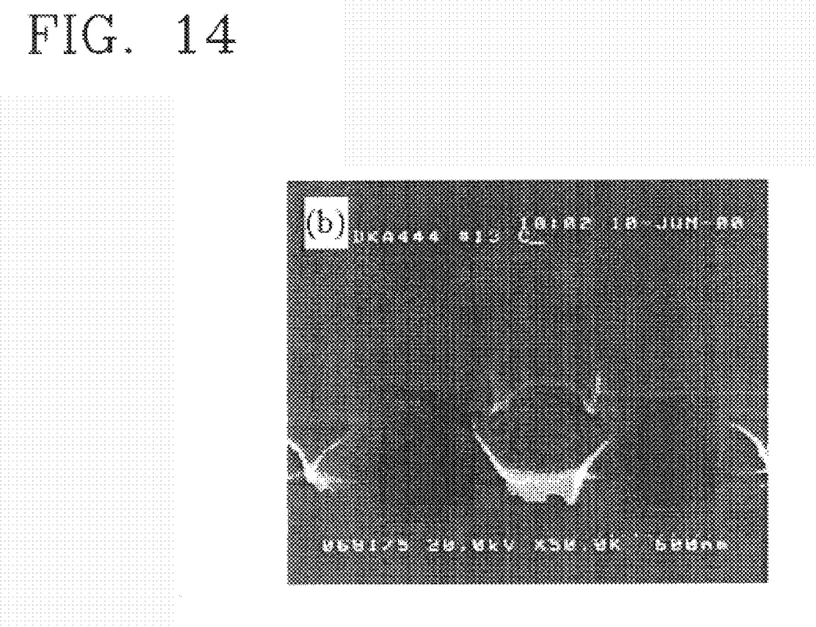
Figure 15:
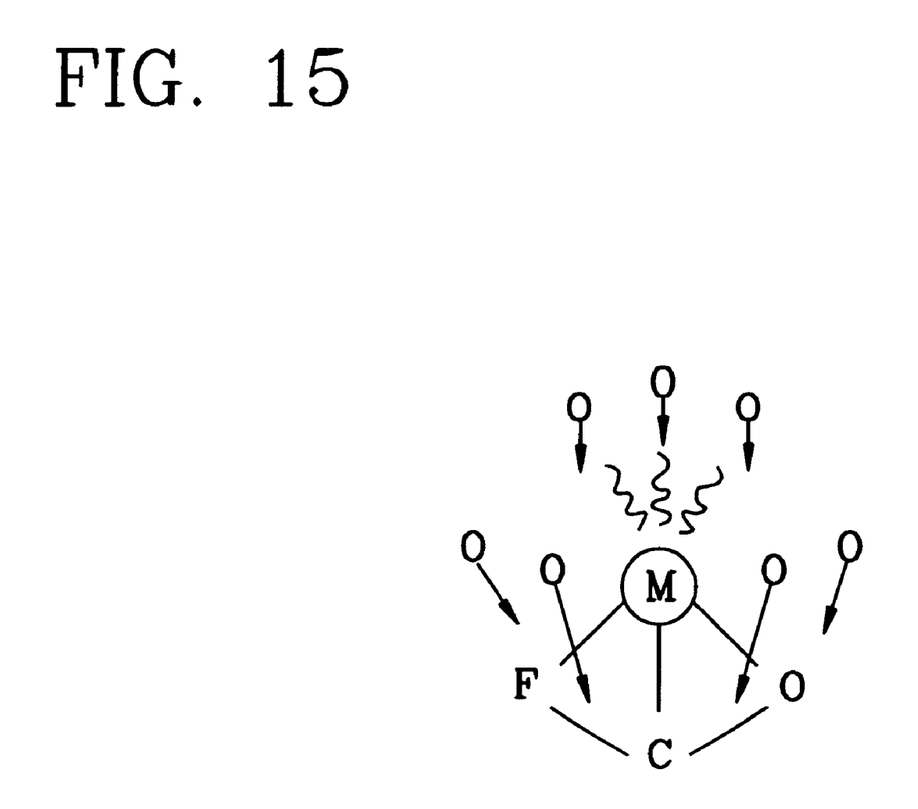
FIG. 15 is a representation drawing showing how chemicals bond as well as the thermal ablation mechanisms.

To remove the hard polymer formed in the via hole etching, the test wafer is treated by a plasma jet with oxygen, $O_2$, as a reactant gas in an atmospheric downstream condition, and subsequently stripped by (EKC) wet stripping. The plasma jet can transform the strongly bonded polymer into a soluble state. It is fairly easy to strip away such treated and transformed polymers by the EKC treatment. As can be seen from FIGS. 13 and 14, hard polymer residues are completely removed, showing excellent wafer uniformity, under the above process conditions of an atmospheric downstream plasma jet system, together with EKC stripping. It should be noted, however, that the ashing efficiency is very sensitive to $O_2$ flow rate and DC power due to a plasma cooling effect by reactant gases.

The chemical reaction equation for hard via polymer removal mechanism is supposed to be as follows: $MC_xF_yO_z + 2O \rightarrow M + CO$ or $CO_2 + F_2$.

As is well known in the art, $AlF_3$ and remaining metal species bear extremely low vapor pressures. To be specific, Al—O bond has 121 Kcal/mole and Al—F bond has 158 Kcal/mole. Therefore, additional activation energy is needed to break such bonds. In the atmospheric downstream plasma jet ashing process of the present invention, such additional activation energy is supplied by oxygen radicals of high density and of high temperature. Accordingly, this energy is transferred to Al, which is known to have good heat capacity along the order of about 24.2 J/mole K. The Al atoms then transform the received thermal energy into mechanical vibration energy to melt or break the bonds of metal species. As a result, the polymer material becomes soluble or dissociable and is easily removed when EKC stripping is applied.

Considering the mechanism of the via-polymer removals in conventional methods, this polymer becomes chemical-soluble in the ashing step and then the remained residues are washed away in the wet-process step. If conventional $O_2$-based plasma is used, the metal-containing residue becomes oxidized and its removal becomes impossible without converting the oxidized metal into water-soluble fluorinated metal with a reactant gas such as fluorine. However, although only $O_2$ chemistry is used in the PJ ashing process, complete removal of the polymer seems to be made possible by high oxygen radical flux. As mentioned previously, since the efficiency of the radical generation by the dissociation process is very high, and plasma and neutral gases are in a state of thermal equilibrium, it is deduced that the radical density is higher than $10^{18}/cm^3$, and the radical thermal energy is around the order of 0.1 eV. Also, considering the bonding strength of Al—O (511 kJ/mole) and Al—F (663.6 kJ/mole) and the good heat capacity of Al (24.2 J/mole K), the ashing mechanism of PJ is considered to be "thermal ablation." Here, Al plays a role of atomic point heater. The oxygen radical of high flux not only removes PR but also transfers the heat flux into the polymer material. Due to good heat capacity, Al absorbs the thermal energy very well and then this energy is converted into kinetic or vibration energy. By this kinetic or vibration energy, various chemical bonds of Al are broken, and the polymer finally becomes soluble so that it can be washed away by the subsequent organic strip (such as an EKC strip).

Determining the Distance Between Torch and Wafer During Treatment

The distance between the torches and a surface to be treated, such as a surface of a wafer, is determined by considering two factors, downstream process and process optimization.

Downstream Process

The device damage caused by charges in plasma is important in an ashing process. If the wafer is too close to the plasma region, the wafer becomes subject to charging damage. Calculating the mean free path of ion ($Ar^+$) for thee-body recombination or radiative recombination, gives a few cm. Considering its enhancement by the magnetic field, the wafer should be located at a position above 10 cm from the torches to minimize damage to the device by charges in the plasma. However, it must be remembered that the distance should not be so great that the removal action by the radical on the surface drops to an unacceptable level. Accordingly, the distance is variable as a function of the level of removal action so long as a certain minimum level of removal action by radical action on the surface is "maintained" as per individual requirements.

The process parameters and corresponding value ranges for the damaged photoresidue ashing are as follows.

Wafer temperature: 100—300° C.
Ar flow rate: 0.5–1 l/min
Torch to wafer distance: 100–200 mm
Minimum plasma generation DC power: 5–15 kW
magnetic field: 13 gauss
wafer rotation: 10~15 cps
Plasma to nozzle distance: 5–15 mm
$O_2$ flow rate: 1–5 l/min depending on the plasma generation power (3 l/min for 3 mm plasma to nozzle distance and 7 kW plasma generation power condition).

In general, the loss process of charged ions is a three-body recombination process:

Ar⁺+e+e→Ar*+e, where Ar* is an excited state of argon gas and a two-particle recombination process is neglected due to the small recombination coefficient. The mean free path for the three-body recombination process ($\lambda_{rec}$) is approximately represented as follow:

$$\lambda_{rec} = \frac{1}{n_e \sigma_{rec}} = \frac{\overline{v}}{n_e^2 K_{rec}} = \frac{\overline{v}}{C n_e^2 T_e^{-9/2}}$$

where $n_e$ is the density of Ar⁺, $\sigma_{rec}$ the cross section for the three-body recombination, $\overline{v}$ the mean velocity of electrons, $K_{rec}$ the rate coefficient for the three-body recombination, $T_e$ the electron temperature, and $C=3.3\times10^{-21}$ m⁶K^{9/2}s⁻¹, a constant. For example, calculating the mean free path for the three-body recombination using typical plasma parameters of torch plasma ($n_e \cong 10^{24}/m^3$ 910% ionization rate at 1 atm where the particle density is about $2.5\times10^{25}/m^3$), $\cong 10^6$ m/s (electron velocity at 1 eV of electron energy), and $T_e \cong 10000$ K (1 eV of electron energy)), gives about 0.03 cm. However, the plasma parameters such as electron density and temperature depend on the applied torch power. The exact dependence of plasma parameters on the applied torch power, however, is dependent upon the system design, such as gas flow pattern, torch design, etc. In general, the electron temperature does not change much, but the electron density conventionally changes within the range of $10^{22}$–$10^{25}/m^3$ as the applied torch power is changed. For this range of electron density, the mean free path for the three-body recombination changes within the range of $3\times10^{-4}$–3 cm. Therefore, considering the direction of Ar flow toward the wafer with an injection angle of 45° and its enhancement by a magnetic field, the wafer should be located at about 10 cm or more from the torch to minimize device damage caused by charges in the plasma.

Process optimization

Oxygen radicals generated in the plasma region diffuse into the downstream region. Through several recombination processes, these oxygen radicals recombine into oxygen molecules. The mean free paths of these recombination processes become on the order of approximately ten cm. Furthermore, as the radicals diffuse, their temperatures cool down through radical expansion in a radial direction, i.e. the cross section of the radical interaction with the wafer expands.

Accordingly, the distance between the torch and wafer must be selected to minimize damage from plasma and to maximize the application of oxygen radicals to the wafer (10–20 cm). Oxygen radicals generated in the plasma region diffuse into the downstream region. Through several recombination processes, these oxygen radicals recombine into oxygen molecules. The possible recombination processes and the rate coefficients are as follows:

$$O + O + O_2 \rightarrow O_2 + O_2 \quad K_{rec} = 2.45 \times 10^{-31} T^{-0.63}$$
$$= 1.3 \times 10^{-31}(300/T)\exp(-170/T)$$
$$O + O + O \rightarrow O_2 + O \quad K_{rec} = 6.2 \times 10^{-32}\exp(-750/T)$$
$$O + O^* + O_2 \rightarrow O_2 + O_2 \quad K_{rec} = 9.9 \times 10^{-33}$$

Assuming the recombination process with the maximum coefficient (the third process) prevails, and using typical parameters of O density ($\approx 10^{25}/m^3$, which is the possible maximum density of O radicals) and 0.1 eV of thermal energy of O radicals, the mean free path for this recombination process becomes as follows.

$$\lambda_{rec} = \frac{1}{n_0 \sigma_{rec}} = \frac{\overline{v}}{n_0^2 K_{rec}} \approx 20 \text{ cm.}$$

The mean free paths of these recombination processes become on the order of approximately ten centimeters. Furthermore, as the radicals diffuse, their temperatures cool down and the radical density decreases through radical expansion in a radial direction, i.e., the cross section of the radical interaction with the wafer expands. Therefore, although this mean free path at low radical density becomes longer, the wafer should be located at the nearest possible position from the plasma zone for process optimization and complete removal of ion-implantation damaged PR and metal-containing post-etch polymer. Also, the applied torch power can affect the O radical temperature and the radical density through the change of dissociation rate caused by the change of plasma parameters. Accordingly, the distance between the torch and wafer should be selected to minimize damage from plasma and to maximize application of oxygen radicals to the wafer, i.e. 10–20 cm.

The relation between torch power and flow rate of reactant gas, the distance between nozzle and plasma, is about 1.5 cm and the diameter of nozzle is about 0.1–0.2 mm. Torch power (6–15 kW) is closely related to radical temperature. If the power is too high, the radical temperature becomes very high. Therefore, it makes the removal of polymers difficult because of the enhancement in the extent of the hardening of the polymer layer. On the other hand, if the power is too low, the radical temperature becomes too low and the radicals cannot transfer the thermal energy enough to completely remove the polymers from the wafer.

The flow rate of plasma-forming gas is related to the stability in plasma formation. In our plasma jet system, the proper flow rate of the plasma-forming gas is 0.5–1 l/min. The flow rate of reactant gas should be considered in two respects: one is plasma cooling due to the interaction between plasma and reactant gas and the other process optimization (maximization of ashing rate). As the flow rate of reactant gas increases, the plasma cooling process is accelerated and complete ashing cannot be achieved. Therefore, the possible range of the flow rate of the reactant gas is 1 . 5 l/min.

In-situ control of water temperature

In-situ control of wafer temperature is extremely important in an ashing processes. If the wafer temperature is too high, hardening of the polymer layer proceeds so that it makes the removal of polymers more difficult. Therefore, since the hardening of polymer occurs above 250 degrees centigrade, in-situ control of the wafer temperature should be below 250 degrees centigrade.

While the invention has been described in detail with reference to particularly preferred embodiments, those skilled in the art will appreciate that various modifications may be made to the invention without departing from the spirit and scope thereof.

What is claimed is:

1. A method of removing metal-containing polymeric material from a surface using an atmospheric downstream plasma jet system, comprising:
   generating radicals having high energy and high density from atmospheric plasma having high density and high energy by introducing a reactant gas to the plasma, wherein the radical density is higher than about $10^{18}/cm^3$ and the radical energy is about 0.1 eV; and placing the surface at a distance from the plasma, whereby ionic reaction on the surface is minimized while the removing action of the radicals on the surface is maintained.

2. A method of removing metal-containing polymeric material from a surface using a plasma jet system according to claim 1, wherein the radicals include oxygen radicals.

3. A method of removing metal-containing polymeric material from a surface using a plasma jet system according to claim 1, wherein the temperature of the surface is between about 100 and about 300 degrees centigrade.

4. A method of removing metal-containing polymeric material from a surface using a plasma jet system according to claim 1, wherein the reactant gas is oxygen, and the reactant gas is introduced at a rate between about 1 and 5 liters per minute.

5. A method of removing metal-containing polymeric material from a surface using a plasma jet system according to claim 1, wherein a distance between a torch of the plasma jet system and the surface is between 80 and 200 mm.

6. A method of removing metal-containing polymeric material from a surface using a plasma jet system according to claim 1, wherein the surface is a front surface of a semiconductor wafer.

7. A method of removing metal-containing polymeric material from a surface using an atmospheric downstream plasma jet system as claimed in claim 1, wherein the high energy and high density plasma is a form or derivative of arc plasma.

8. A method of removing metal-containing polymeric material from a surface using a plasma jet system according to claim 1, wherein the reactant gas is introduced through a nozzle.

9. A method of removing metal-containing polymeric material from a surface using a plasma jet system according to claim 8, wherein the distance between the nozzle and the plasma is between 5 and 15 mm.

10. A method of removing polymeric material from a surface using an atmospheric downstream plasma jet system, comprising:

generating high density and high energy plasma;

passing a reaction gas through an atmospheric plasma zone of the plasma jet system in which the high density and high energy plasma was generated to generate radicals having high energy and high density, wherein the radical density is higher than about $10^{18}/cm^3$ and the radical energy is about 0.1 eV; and placing the surface at a distance from the plasma zone, whereby ionic reaction on the surface is minimized while the removing action of the radicals on the surface is maintained.

11. A method of removing polymeric material from a surface using a plasma jet system according to claim 10, wherein the radicals include oxygen radicals.

12. A method of removing polymeric material from a surface using a plasma jet system according to claim 10, wherein the temperature of the surface is between about 100 and about 300 degrees centigrade.

13. A method of removing polymeric material from a surface using a plasma jet system according to claim 10, wherein the reactant gas is oxygen, and the reactant gas is introduced at a rate between about 1 and 5 liters per minute.

14. A method of removing polymeric material from a surface using a plasma jet system according to claim 10, wherein a distance between a torch of the plasma jet system and the surface is between 80 and 200 mm.

15. A method of removing polymeric material from a surface using a plasma jet system according to claim 10, wherein the surface is a front surface of a semiconductor wafer.

16. A method of removing polymeric material from a surface using a plasma jet system according to claim 10, wherein the reactant gas is introduced through a nozzle.

17. A method of removing polymeric material from a surface using a plasma jet system according to claim 16, wherein the distance between the nozzle and the plasma is between 5 and 15 mm.

18. A method of removing polymeric material from a surface using an atmospheric downstream plasma jet system as claimed in claim 10, wherein the high energy and high density plasma is a form or derivative of arc plasma.

19. A method of removing photoresists or other organic/polymer materials having a chemical structure similar to those of photoresists from a surface using an atmospheric downstream plasma jet system, wherein the photoresist or other organic/polymer materials have been hardened by ion beams or atomic/molecular fluxes of any kind during device manufacturing, comprising:

generating radicals having high energy and high density from atmospheric plasma of high energy and high density by introducing a reactant gas to the plasma, wherein the radical density is higher than about $10^{18}/cm^3$ and the radical energy is about 0.1 eV; and placing the surface at a distance from the plasma, whereby ionic reaction on the surface is minimized while the removing action of the radicals on the surface is maintained.

20. A method of removing photoresists or other organic/polymer materials having a chemical structure similar to those of photoresists from a surface using an atmospheric downstream plasma jet system as claimed in claim 19, wherein the high energy and high density plasma is a form or derivative of arc plasma.

21. A method of removing photoresists or other organic/polymer materials having a chemical structure similar to those of photoresists from a surface using an atmospheric downstream plasma jet system, wherein the photoresist or other organic/polymer materials have been hardened by ion beams or atomic/molecular fluxes of any kind during device manufacturing, comprising:

generating a high energy and high density plasma;

passing a reaction gas through an atmospheric plasma zone of the plasma jet system in which the high energy and high density plasma was generated to generate radicals having high energy and high density, wherein the radical density is higher than about $10^{18}/cm^3$ and the radical energy is about 0.1 eV; and placing the surface at a distance from the plasma zone, whereby ionic reaction on the surface is minimized while the removing action of the radicals on the surface is maintained.

22. A method of removing photoresists or other organic/polymer materials having a chemical structure similar to those of photoresists from a surface using an atmospheric downstream plasma jet system as claimed in claim 21, wherein the high energy and high density plasma is a form or derivative of arc plasma.

23. A method of removing metal-containing polymeric material from a front surface of a semiconductor wafer using a plasma jet system, comprising generating radicals having high energy and high density from atmospheric plasma by introducing a reactant gas to the plasma; and placing the front surface of the semiconductor wafer at a distance from the plasma, whereby ionic reaction on the front surface of the semiconductor wafer is minimized while the removing action of the radicals on the front surface of the semiconductor wafer is maintained, wherein the semiconductor wafer is rotated at 10 to 15 cycles per second about its center axis perpendicular to the plane of the front surface of the semiconductor wafer to achieve uniform removal action.

24. A method of removing metal-containing polymeric material from a surface using a plasma jet system according to claim 23, wherein a plurality of wafers are arranged in a tray pattern and rotated about a plane of the tray pattern, whereby each wafer is successively exposed to radical removal action as it is rotated about the plane of the tray pattern.

25. A method of removing polymeric material from a front surface of a semiconductor wafer using a plasma jet system, comprising:

passing a reaction gas through an atmospheric plasma zone of the plasma jet system to generate radicals having high energy and high density; and placing the front surface of the semiconductor wafer at a distance from the plasma zone, whereby ionic reaction on the front surface of the semiconductor wafer is minimized while the removing action of the radicals on the front surface of the semiconductor wafer is maintained, wherein the semiconductor wafer is rotated at 10 to 15 cycles per second about its center axis perpendicular to the plane of the front surface of the semiconductor wafer to achieve uniform removal action.

26. A method of removing polymeric material from a surface using a plasma jet system according to claim 25, wherein a plurality of wafers are arranged in a tray pattern and rotated about a plane of the tray pattern, whereby each wafer is successively exposed to radical removal action as it is rotated about the plane of tray pattern.

* * * * *